(12) United States Patent
Fu et al.

(10) Patent No.: US 7,985,091 B1
(45) Date of Patent: Jul. 26, 2011

(54) LOCKING MECHANISM AND INFORMATION HANDLING SYSTEM USING THE SAME

(75) Inventors: Jia-Qi Fu, Shenzhen (CN); Wei Qiu, Shenzhen (CN); Hai-Chen Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/982,916

(22) Filed: Dec. 31, 2010

(30) Foreign Application Priority Data

Dec. 7, 2010 (CN) .......................... 2010 10 576802

(51) Int. Cl.
*H01R 13/62* (2006.01)
(52) U.S. Cl. ...................................................... 439/345
(58) Field of Classification Search .................. 439/298, 439/368, 365, 345, 354, 358, 357, 557, 595
See application file for complete search history.

(56) References Cited

U.S. PATENT DOCUMENTS

| | | | | |
|---|---|---|---|---|
| 5,486,117 | A * | 1/1996 | Chang | 439/357 |
| 6,579,114 | B2 * | 6/2003 | Lord | 439/358 |
| 6,796,844 | B1 * | 9/2004 | Edwards, III | 439/638 |
| 7,025,636 | B2 * | 4/2006 | Allen | 439/638 |
| 2005/0009404 | A1 * | 1/2005 | Lee | 439/638 |
| 2005/0039502 | A1 * | 2/2005 | Avganim | 70/58 |
| 2005/0202698 | A1 * | 9/2005 | Miao | 439/133 |
| 2006/0052001 | A1 * | 3/2006 | Parker | 439/358 |
| 2008/0041125 | A1 * | 2/2008 | Poppe | 70/57 |
| 2008/0096413 | A1 * | 4/2008 | Chen | 439/345 |
| 2009/0286419 | A1 * | 11/2009 | Koyama et al. | 439/358 |
| 2010/0227493 | A1 * | 9/2010 | Guy et al. | 439/345 |
| 2010/0285681 | A1 * | 11/2010 | Saruwatari | 439/345 |

* cited by examiner

*Primary Examiner* — Briggitte R Hammond
(74) *Attorney, Agent, or Firm* — Zhigang Ma

(57) ABSTRACT

A data storage device is inserted in an information handling apparatus, and is prevented from being accidentally disconnected from the information handling apparatus by a locking mechanism. The locking mechanism includes a frame receiving the data storage device, and a retainer mounted to the frame. The retainer includes two resilient arms extending out of the frame to be correspondingly secured in two retaining holes defined in the information handling apparatus.

12 Claims, 3 Drawing Sheets

LOCKING MECHANISM AND INFORMATION HANDLING SYSTEM USING THE SAME

BACKGROUND

1. Technical Field

The present disclosure relates to locking mechanisms, and particularly to a locking mechanism for preventing a data storage device from being accidentally disconnected form an information handling apparatus.

2. Description of Related Art

A data storage device, such as a universal serial bus disk, is often inserted into a peripheral port of an information handling apparatus, such as a server, for data transmission. However, there may be a risk of the data storage device being accidentally disengaged from the information handling apparatus, thereby interrupting the data transmission.

BRIEF DESCRIPTION OF THE DRAWINGS

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
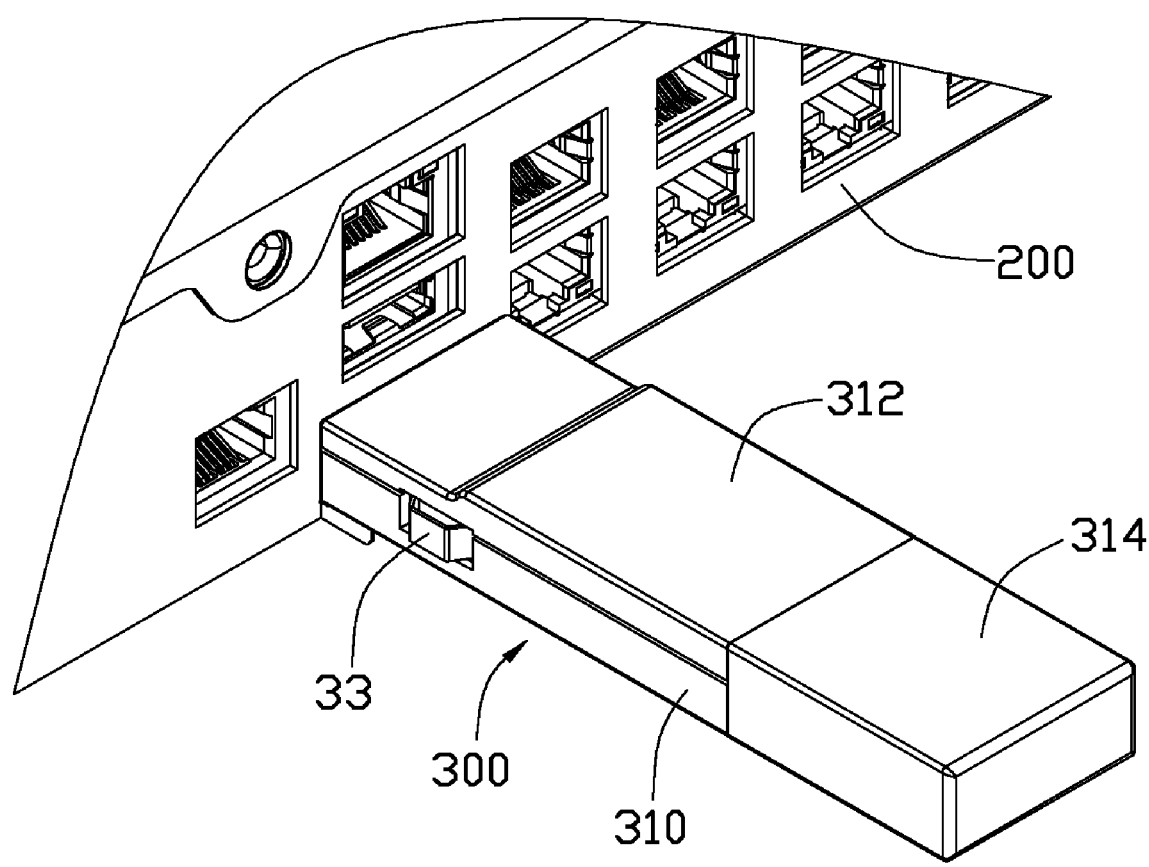
FIG. 1 is an assembled, isometric view of an exemplary embodiment of an information handling system, which includes an information handling apparatus, a data storage device, and a locking mechanism.
Figure 2:
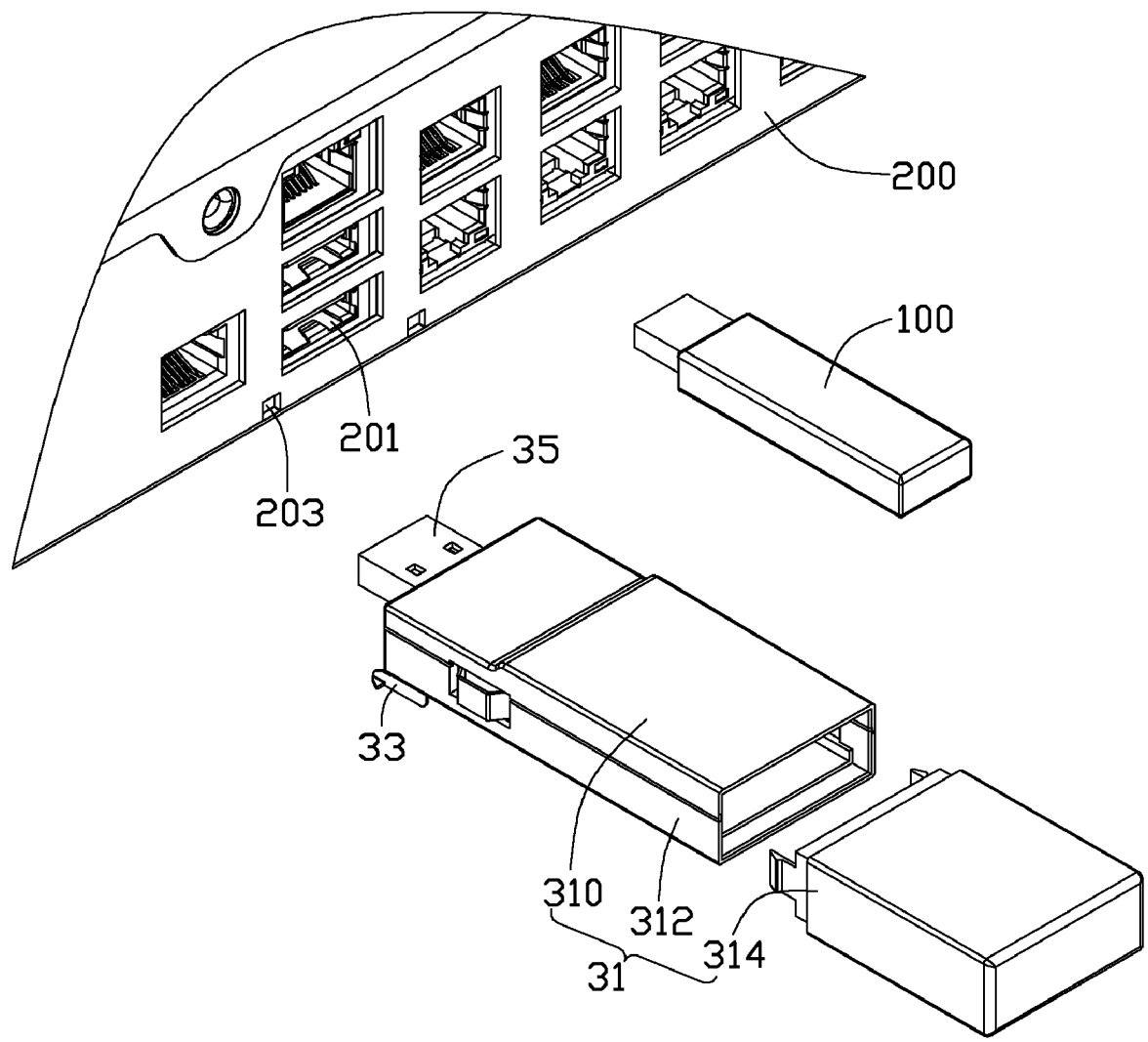
FIG. 2 is an exploded, isometric view of FIG. 1.

Referring to FIGS. 1 and 2, an exemplary embodiment of an information handling system includes an information handling apparatus 200, a locking mechanism 300 connected to the apparatus 200, and a data storage device 100 received in the locking mechanism 300 and electrically coupled to the information handling apparatus 200 through the locking mechanism 300.

In one embodiment, the data storage device 100 is a universal serial bus disk. The apparatus 200 is a server, and defines a peripheral port 201, and two retaining holes 203 arranged at opposite sides of the peripheral port 201.

Figure 3:
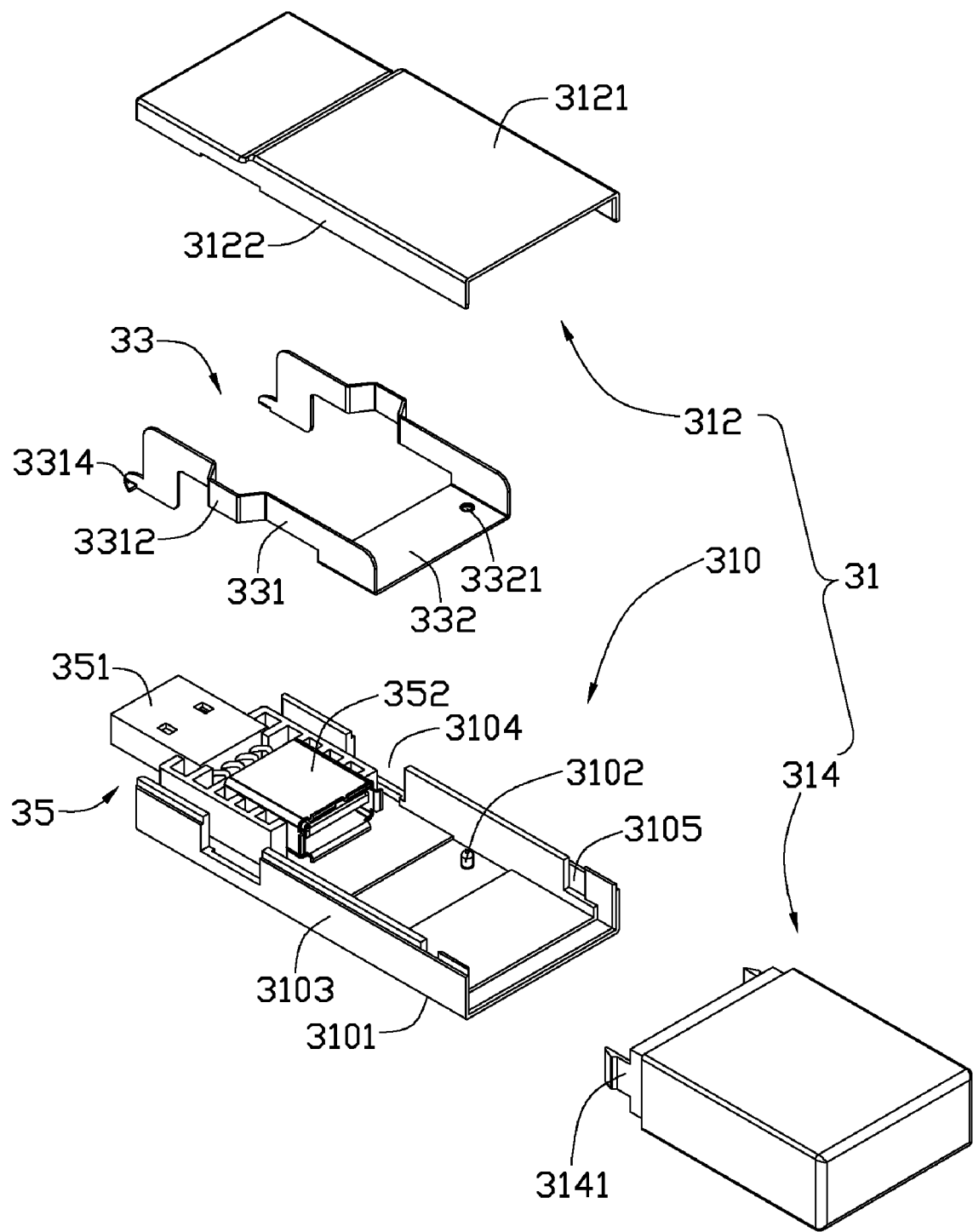
FIG. 3 is an exploded, isometric view of the locking mechanism of FIG. 1.

Referring to FIG. 3, the locking mechanism 300 includes a frame 31, a resilient retainer 33, and an adapter 35 secured in the frame 31.

The frame 31 includes a base 310, a cover 312, and a cap 314. The base 310 includes a bottom wall 3101, and two sidewalls 3103 perpendicularly extending up from opposite sides of the bottom wall 3101. A positioning pin 3102 extends up from the bottom wall 3101. Each of the sidewalls 3103 defines a notch 3104 adjacent to a front end of the base 310, and a recess 3105 in an inner surface of the sidewall 3103 and adjacent to a rear end of the base 310. In one embodiment, the cover 312 is made of transparent material, and includes a top wall 3121, and two flanges 3122 perpendicularly extending down from opposite sides of the top wall 3121. The top wall 3121 is stepped with a front portion of the top wall 3121 being lower than a rear portion of the top wall 3121. The cap 314 is a substantially rectangular box with an open front end, and two hooks 3141 extend forward from opposite ends of the front end of the cap 314.

The retainer 33 is a substantially U-shaped spring piece, and comprises two resilient arms 331 and a mounting portion 332 connected between bottoms of rear ends of the resilient arms 331. Each of the resilient arms 331 includes a manipulation portion 3312 protruding out from the resilient arm 331, away from the other resilient arm 331. A retaining tab 3314 is formed at an outer surface of a front end of each of the resilient arms 331, opposite to the mounting portion 332. The mounting portion 332 defines a positioning hole 3321.

The adapter 35 is secured in the front end of the base 310, and includes a first connector 351 extending forward out of the base 310, and a second connector 352 facing the rear end of the base 310. The first connector 351 is adapted to engage in the peripheral port 201 of the information handling apparatus 200. The second connector 352 is adapted to engage with the data storage device 100.

In assembly, the retainer 33 is mounted to the base 310, with the positioning pin 3102 of base 310 fixed in the positioning hole 3321 of the retainer 33. The resilient arms 331 of the retainer 33 respectively abut against inner surfaces of the sidewalls 3103 of the base 310, with the manipulation portions 3312 of the resilient arms 331 protruding out of the base 310 through the notches 3104 of the corresponding sidewalls 3103 of the base 310. The retaining tabs 3314 extend out of the frame 31 in front of the frame 31. The cover 312 is covered on a top of the base 310. The data storage device 100 is slid into the base 310 from the rear end of the base 310, to engage with and be electrically connected to the second connector 352 of the adapter 35. Since the cover 312 is transparent, it is convenient for checking whether the data storage device 100 is properly engaged with the adapter 35. The cap 314 is mounted to the rear end of the base 310, with the hooks 3141 correspondingly retained in the recesses 3105 of the sidewalls 3103 of the base 310. Therefore, the data storage device 100 is prevented from being accidentally drawn out of the base 310 and disconnected from the adapter 35.

Referring to FIG. 1 again, in use, the locking mechanism 300 is manipulated to allow the first connector 351 to be inserted into the peripheral port 201 of the apparatus 200 and electrically connected to the apparatus 200. Therefore, the data storage device 100 is electrically coupled to the apparatus 200 for data transmission through the adapter 35. At the same time, the retaining tabs 3314 of the resilient arms 331 of the retainer 33 are engaged in the corresponding retaining holes 203 of the apparatus 200 to secure the locking mechanism 300 to the apparatus 200. Therefore, the adapter 35 is prevented from being accidentally disconnected from the apparatus 200. Because the top wall 3121 of the cover 312 is stepped with the front portion of the top wall 3121 lower than the rear portion of the top wall 3121, a space is provided for manipulation of another port of the apparatus 200 above the peripheral port 201 of the apparatus 200.

To detach the data storage device 100 from the apparatus 200 with the base 310 remaining being mounted to the apparatus 200, the cap 314 is removed from the base 310 to expose the data storage device 100 from the rear end of the base 310. The data storage device 100 is drawn to the rear to be disconnected from the second connector 352 of the adapter 35, and thus can be removed out of the base 310.

To detach the data storage device 100 together with the locking mechanism 300 from apparatus 200, the manipulation portions 3312 of the retainer 31 are pressed towards each other to deform the resilient arms 331 and make the retaining tabs 3314 disengage from the retaining holes 203 of the apparatus 200. The locking mechanism 300 and the data storage device 100 received in the locking mechanism 300 then can be slid to the rear away from the apparatus 200 to disengage from the apparatus 200.

It is to be understood, however, that even though numerous characteristics and advantages of the embodiment have been set forth in the foregoing description, together with details of the structure and function of the embodiment, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A locking mechanism to prevent a data storage device from disengaging from an information handling apparatus defining a peripheral port, the locking mechanism comprising:
   a frame to receive the data storage device; and
   an adapter fixed in the frame, to be electrically connected between the information handling apparatus and the data storage device; and
   a retainer retained to the frame, to be detachably secured to the information handling apparatus.

2. The locking mechanism of claim 1, wherein the frame comprises a base to support the data storage device, and a cap mounted to a rear end of the base to prevent the data storage device from moving rearwards.

3. The locking mechanism of claim 2, wherein the adapter is secured to a front end of the base, and comprises a first connector exposed out of the base through the front end of the base to engage in the peripheral port of the information handling apparatus, and a second connector facing the cap to engage with the data storage device.

4. The locking mechanism of claim 3, wherein the retainer comprises two resilient arms, a retaining tab is formed at a front end of each of the resilient arms and extends out of the base through the front end to engage in the information handling apparatus adjacent to the peripheral port.

5. The locking mechanism of claim 4, wherein the base comprises a bottom wall, two sidewalls substantially perpendicularly extending up from opposite sides of the bottom wall, each of the sidewalls of the base defines a notch, each of the resilient arms of the retainer forms a manipulation portion protruding out of the frame through the notch of the corresponding sidewall of the base.

6. The locking mechanism of claim 5, wherein the retainer further comprises a mounting portion connected between rear ends of the resilient arms, and defining a positioning hole, a positioning pin extends from the bottom wall of the base and is secured in the positioning hole of the retainer.

7. The locking mechanism of claim 2, wherein the frame further comprises a cover mounted to a top of the base.

8. The locking mechanism of claim 7, wherein the cover is transparent, and stepped with a front portion of the top wall being lower than a rear portion of the top wall.

9. An information handling system comprising:
   an information handling apparatus comprising a peripheral port;
   a data storage device;
   a frame receiving the data storage device;
   a retainer mounted to the frame and detachably secured to the information handling apparatus; and
   an adapter fixed in the frame, and comprising a first connector engagable with the peripheral port of the information handling apparatus, and a second connector engagable with the data storage device, to make the data storage device be electrically coupled to the information handling apparatus for data transmission through the adapter.

10. The information handling system of claim 9, wherein the information handling apparatus defines a retaining hole adjacent to the peripheral port, the retainer comprises a resilient arm extending out of a front end of the frame to be detachably engaged in the retaining hole of the information handling apparatus.

11. The information handling system of claim 9, wherein the frame comprises a base to support the data storage device, and a cap mounted to a rear end of the base to prevent the data storage device from moving rearwards.

12. The information handling system of claim 9, wherein the data storage device is a universal serial bus disk.

* * * * *